(12) United States Patent
Adusumilli et al.

(10) Patent No.: US 9,570,574 B1
(45) Date of Patent: Feb. 14, 2017

(54) RECESSED METAL LINER CONTACT WITH COPPER FILL

(71) Applicant: International Business Machines Corporation, Armonk, NY (US)

(72) Inventors: Praneet Adusumilli, Albany, NY (US); Veeraraghavan S. Basker, Schenectady, NY (US); Huiming Bu, Glenmont, NY (US); Zuoguang Liu, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/180,171

(22) Filed: Jun. 13, 2016

Related U.S. Application Data

(62) Division of application No. 15/018,387, filed on Feb. 8, 2016.

(51) Int. Cl.
| | | |
|---|---|---|
| *H01L 21/768* | (2006.01) | |
| *H01L 29/45* | (2006.01) | |
| *H01L 27/088* | (2006.01) | |
| *H01L 21/3105* | (2006.01) | |
| *H01L 21/311* | (2006.01) | |
| *H01L 21/3213* | (2006.01) | |
| *H01L 23/535* | (2006.01) | |

(52) U.S. Cl.
CPC ......... *H01L 29/45* (2013.01); *H01L 21/31051* (2013.01); *H01L 21/31138* (2013.01); *H01L 21/3213* (2013.01); *H01L 21/76846* (2013.01); *H01L 21/76877* (2013.01); *H01L 23/535* (2013.01); *H01L 27/0886* (2013.01)

(58) Field of Classification Search
CPC ................... H01L 21/76877; H01L 21/76846; H01L 21/3213
See application file for complete search history.

(56) References Cited

PUBLICATIONS

List of IBM Patents or Patent Applications Treated as Related; (Appendix P), Filed Jun. 13, 2016; 2 pages.
Praneet Adusumilli et al., "Recessed Metal Liner Contact With Copper Fill", U.S. Appl. No. 15/018,387, filed Feb. 8, 2016.

*Primary Examiner* — Douglas Menz
(74) *Attorney, Agent, or Firm* — Cantor Colburn LLP; Vazken Alexanian

(57) ABSTRACT

A method of fabricating a contact above a source or drain region of an integrated circuit includes depositing a first liner conformally in a bottom and along a sidewall of a trench formed above the source or drain region, depositing a second liner conformally over the first liner, and stripping the first liner and the second liner from a portion of the sidewall from an opening of the trench to a height above the bottom of the trench. The method also includes depositing a third liner conformally over the second liner on the bottom and to the height above the bottom of the trench and on the portion of the sidewall, and depositing a metal fill to fill the trench.

14 Claims, 23 Drawing Sheets

RECESSED METAL LINER CONTACT WITH COPPER FILL

This application is a division of U.S. patent application Ser. No. 15/018,387 filed Feb. 8, 2016, the disclosure of which is incorporated by reference herein in its entirety.

BACKGROUND

The present invention relates to integrated circuits, and more specifically, to a recessed metal liner contact with copper fill.

A metal-oxide-semiconductor field-effect transistor (MOSFET) is a transistor used for switching electronic signals. Generally, the MOSFET includes a source, a drain, and a metal oxide gate electrode. The metal gate is electrically insulated from the main semiconductor n-channel or p-channel by a thin layer of insulating material such as, for example, silicon dioxide or a high dielectric constant (high-k) dielectric, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions. Complementary metal-oxide semiconductor (CMOS) general refers to complementary and symmetrical pairs of p-type and n-type MOSFETs for logic functions. A FinFET is a type of MOSFET. The FinFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

In integrated circuits (ICs) such as those using complemental metal-oxide semiconductor (CMOS) technology, for example, pitch scaling is done to reduce device dimensions. Traditionally, source and drain contacts result from a contact metal (e.g., tungsten (W)) being used to fill in a trench formed above the source and drain regions. The fill metal is separated from the spacer that is used to form the trench by a liner. In current ICs, these liners have not been scaled along with the contacts. As a result, the volume of contact metal has been reduced according to the reduced contact size.

SUMMARY

According to an embodiment of the present invention, a method of fabricating a contact above a source or drain region of an integrated circuit includes depositing a first liner conformally in a bottom and along a sidewall of a trench formed above the source or drain region; depositing a second liner conformally over the first liner; stripping the first liner and the second liner from a portion of the sidewall from an opening of the trench to a height above the bottom of the trench; depositing a third liner conformally over the second liner on the bottom and to the height above the bottom of the trench and on the portion of the sidewall; and depositing a metal fill to fill the trench.

According to another embodiment, a contact for a source or drain region of an integrated circuit includes a first liner conformally disposed to cover a bottom of the contact and along a sidewall of the contact from the bottom to a height, the height being less than a full height of the contact such that a portion of the sidewall of the contact is not covered by the first liner; a second liner conformally disposed over the first liner on the bottom and up to the height of the sidewall of the contact; a third liner conformally disposed over the second liner one the bottom and up to the height of the sidewall and also covering the portion of the sidewall of the contact; and a metal fill filling a volume of the contact defined by the third liner.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-22 show cross-sectional views that illustrate processes involved in fabricating an integrated circuit according to embodiments, in which:

FIG. 1 shows an intermediate structure with trenches that are used to form the source and drain contacts;

FIG. 2 shows the intermediate structure that results from deposition of titanium (Ti) on the structure shown in FIG. 1;

FIG. 3 shows the intermediate structure that results from deposition of titanium nitride (TiN) over the Ti layer shown in FIG. 2;

FIG. 4 shows the intermediate structure that results from deposition of an organic planarization layer (OPL) to fill the trenches;

FIG. 5 shows the result of a reactive ion etch (RIE) on the OPL;

FIG. 6 shows the result of a wet etch process to strip the Ti and TiN layers above the OPL;

FIG. 7 is a cross-sectional view of an intermediate structure with the OPL removed;

FIG. 8 shows the result of depositing a liner on the intermediate structure shown in FIG. 7;

FIG. 9 results from deposition of copper (Cu) as a contact metal;

FIG. 10 shows source and drain contacts that result from a chemical mechanical planarization (CMP) process; and FIG. 11 results from deposition of an interlayer dielectric (ILD) material above the source and drain contacts;

FIG. 12 shows an organic planarization layer (OPL) and silicon-based anti-reflective coating (SiARC) deposited on the ILD material;

FIG. 13 shows a cross-sectional view of an intermediate structure resulting from deposition and patterning of a resist above the SiARC;

FIG. 14 results from a reactive ion etch to extend the openings in the resist to the source and drain contacts;

FIG. 15 shows an intermediate structure following stripping of the OPL and SiARC;

FIG. 16 shows another OPL layer deposited on the ILD material and in the openings and another SiARC layer above the OPL layer;

FIG. 17 shows a cross-sectional view of an intermediate structure resulting from deposition and patterning another resist above the SiARC;

FIG. 18 results from a reactive ion etch to extend the openings in the resist to the gate stack;

FIG. 19 shows an intermediate structure following stripping of the OPL and SiARC;

FIG. 20 shows the result of conformally depositing a liner over the ILD layer and within the openings;

FIG. 21 results from deposition of copper in the openings of the ILD layer on liner;

FIG. 22 is a cross-sectional view of an intermediate structure that includes gate contacts.

DETAILED DESCRIPTION

As noted above, size reduction of ICs (e.g., CMOS devices) has resulted in a reduced volume of fill metal based on the liner material not being scaled down along with the contact. This reduction in contact material results in an undesirable increase in resistance. Embodiments of the devices and methods detailed herein relate to a recessed liner in the trenches used to form the source and drain contacts as well as a copper (Cu) fill.

Figure 1:
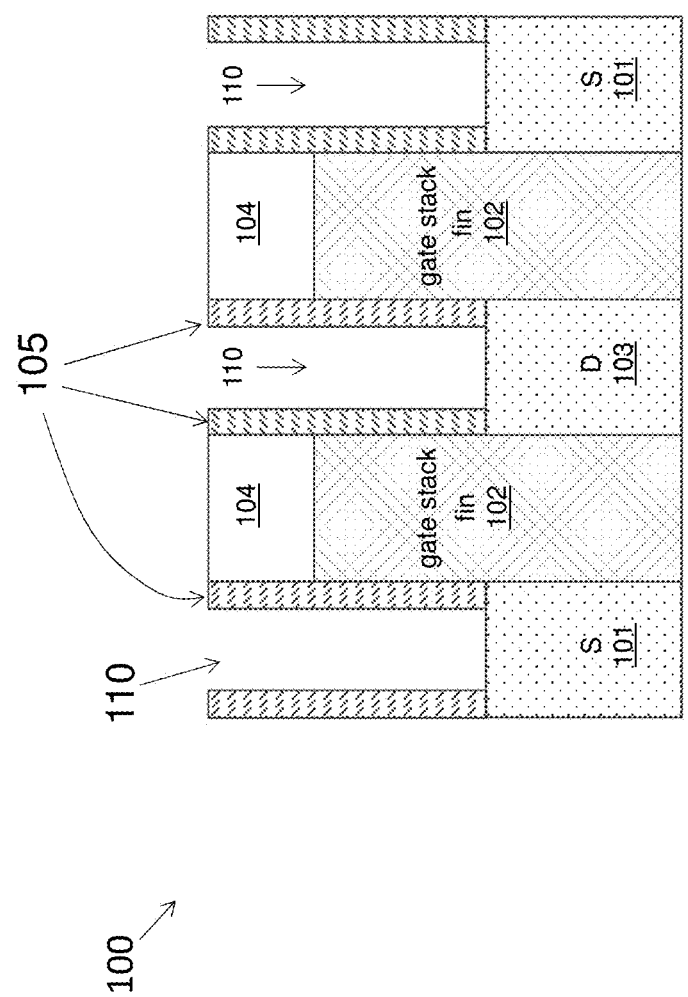

FIGS. 1-22 show cross-sectional views that illustrate processes involved in fabricating an integrated circuit according to embodiments of the invention. The figures specifically detail the fabrication of source and drain contacts of a CMOS device according to embodiments. FIG. 1 shows an intermediate structure 100 with trenches 110. These trenches 110 are used to form contacts. The intermediate structure 100 shown in FIG. 1 is preceded by known processes. The known processes form the source regions 101 and the drain region 103 shown in FIG. 1, with metal gate stacks 102 formed as fins therebetween on a substrate (not shown). The known fin formation processes include depositing a hard mask material over the substrate and patterning the fins by sidewall imaging transfer, for example. In FIG. 1, the spacers 105 used to form the trenches 110 may be nitride-based (e.g., silicon nitride (SiN)). Self-aligned contact (SAC) caps 104 are formed on the gate stacks 102. Self-aligned indicates that the source and drain contacts 1010 (FIG. 10) are aligned to the gate stacks 102. By eliminating the need for a gap between the source and drain contacts 1010 and the gate stack 102, the self-aligned contacts facilitate decreased gate pitch. In addition the SAC caps 104 address alignment issues of the source and drain contacts 1010 (with the source and drain regions 101, 103). The trenches 110 are formed by etching an oxide fill relative to the spacers 105.

Figure 2:
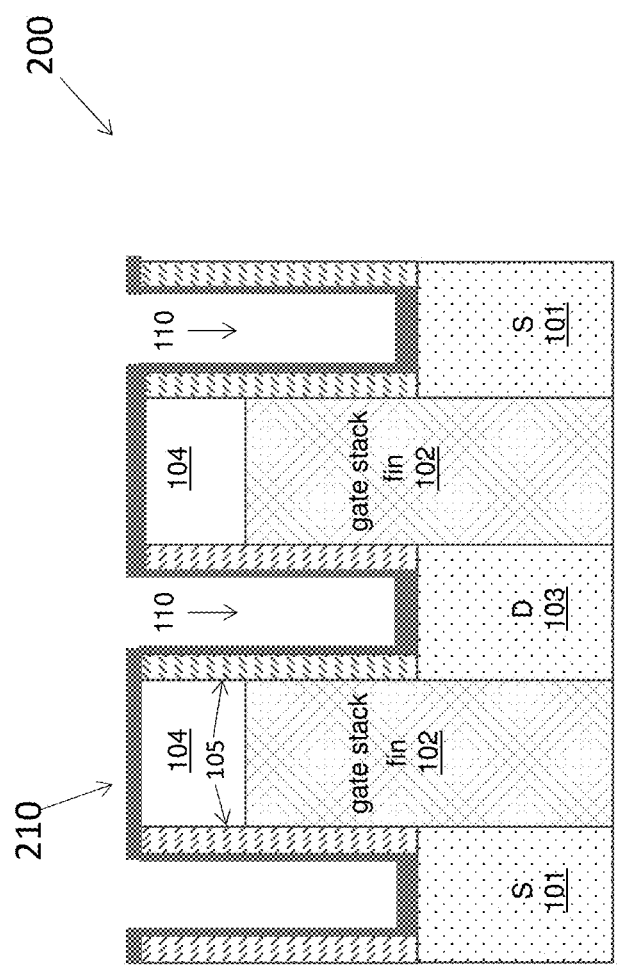
Figure 3:
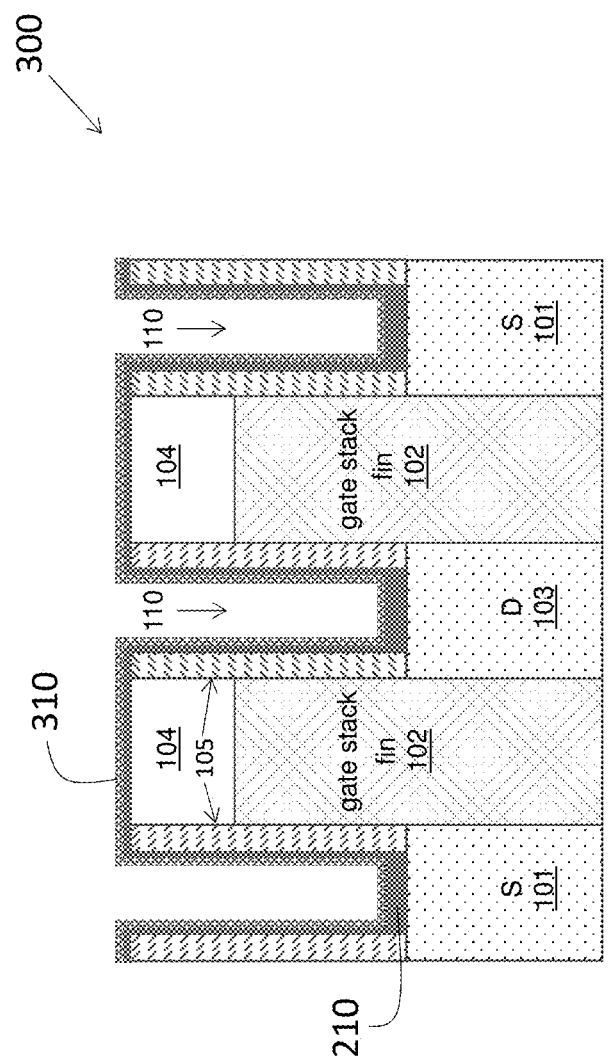

FIG. 2 shows the intermediate structure 200 that results from deposition of titanium (Ti) 210 on the structure 100 shown in FIG. 1. The deposition may be done by physical vapor deposition (PVD), as shown. The deposition by PVD involves condensation of Ti 210 on all the surfaces of the structure 100 and results in a thicker layer of Ti 210 at the bottom of the trenches 110 than on the sidewalls. In alternate embodiments, the deposition of Ti 210 may be by chemical vapor deposition (CVD), which involves a chemical process and results in a conformal layer of uniform thickness of Ti 210 (i.e., thickness of Ti 210 would be the same on sidewall and floor surfaces). FIG. 3 shows the intermediate structure 300 that results from deposition of titanium nitride (TiN) 310 over the Ti 210 layer shown in FIG. 2. The deposition may be by CVD. In alternate embodiments, deposition of the TiN 310 may be accomplished by atomic vapor deposition (ALD). In either case, a conformal layer of TiN 310 results, as shown.

Figure 4:
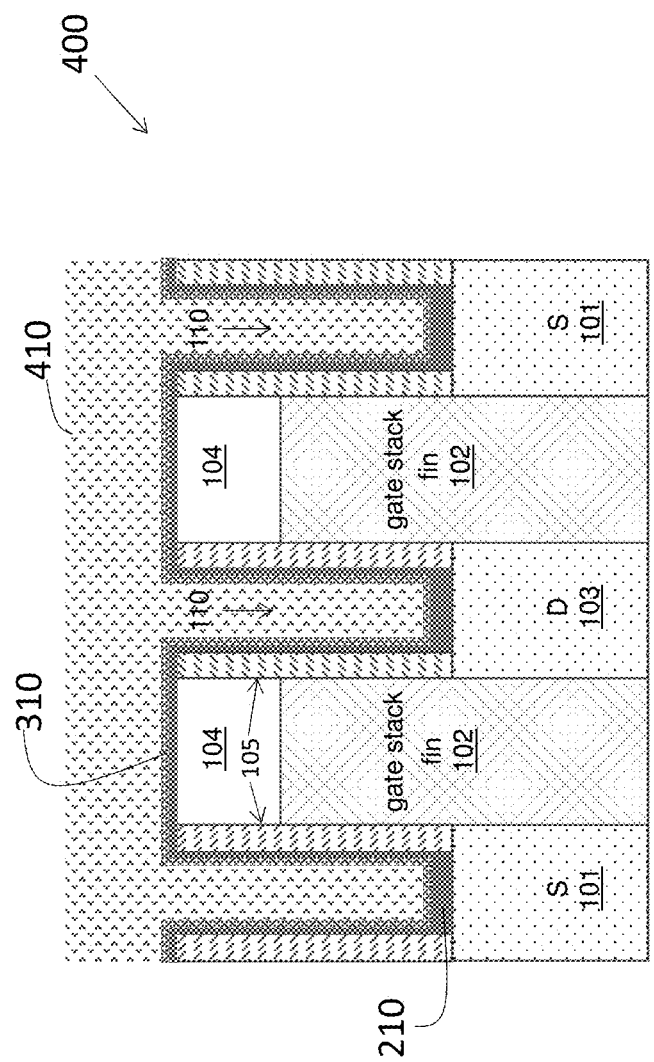
Figure 6:
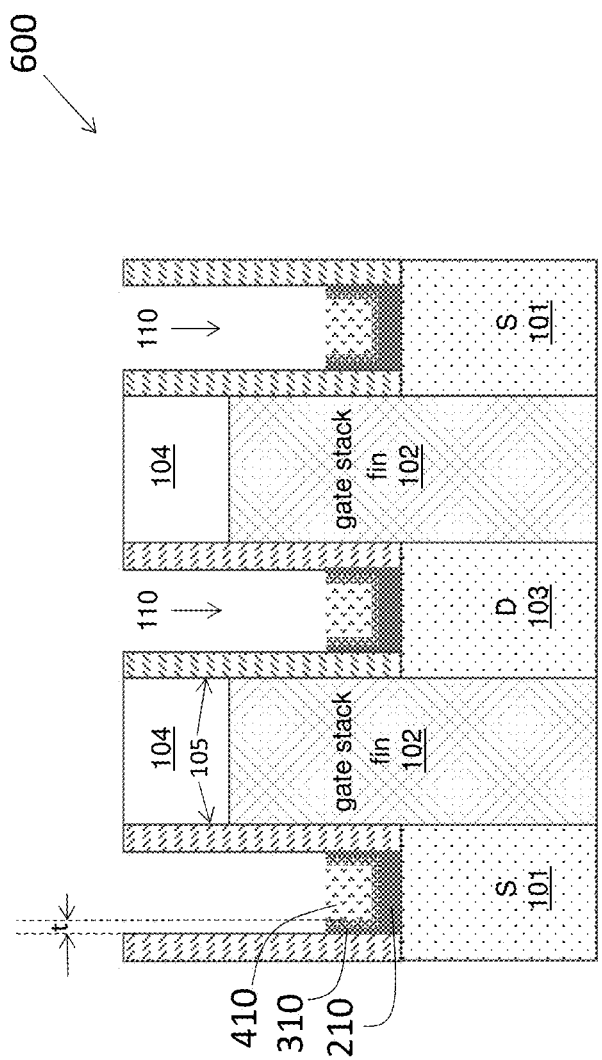
Figure 7:
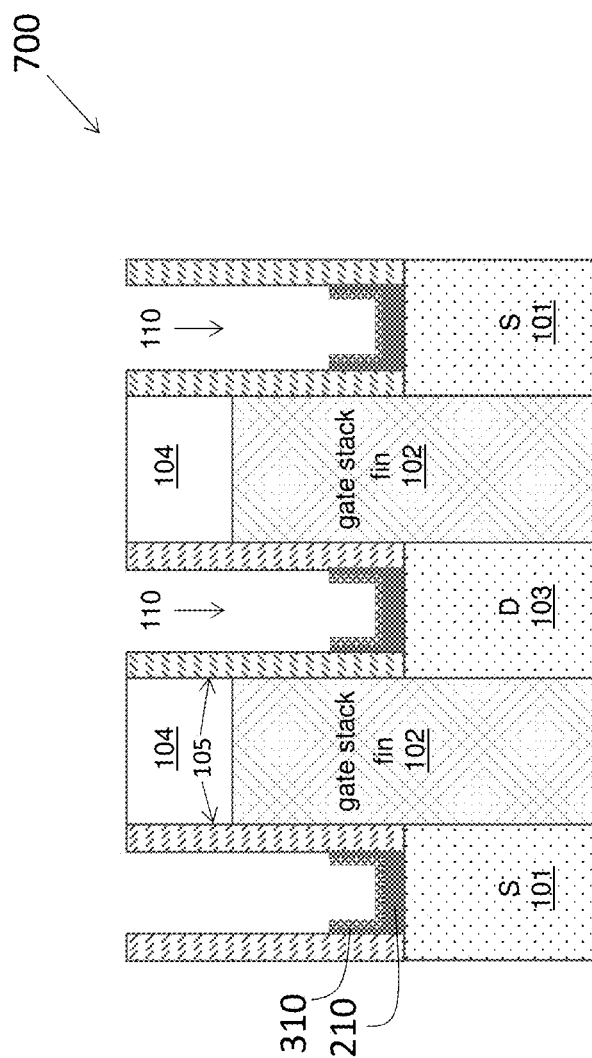

FIG. 4 shows the intermediate structure 400 that results from deposition of an organic planarization layer (OPL) 410 to fill the trenches 110. The OPL 410 may be an organic polymer including carbon (C), hydrogen (H), and nitrogen (N), for example, and may be deposited by a spin coating process. As FIG. 4 illustrates, the OPL 410 is deposited to fill the trenches 110 and also form a layer above the intermediate structure 300 shown in FIG. 3. A reactive ion etch (ME) process is performed on the OPL 410 to recess the OPL 410 as shown in the intermediate structure 500 in FIG. 5. The thickness of the OPL 410 at the bottom of the trenches 110 may be 6-15 nanometers (nm), for example. A wet etch process may then be performed to strip the Ti 210 and TiN 310 layers above the recessed OPL 410, as shown for the intermediate structure 600 in FIG. 6. The thickness t of the remaining Ti 210 and TiN 310 on the sidewall of the trenches 110 may be on the order of 7-20 nm, for example. The illustrative cross-sectional figures are not shown to relative scale according to the exemplary thickness ranges noted here. Specifically, the thickness of the remaining OPL 410 is shown relatively larger (deeper) as compared with the thickness of the Ti 210 and TiN 310 layers for explanatory purposes. FIG. 7 shows an intermediate structure 700 that results from removing the recessed OPL 410 at the bottom of the trenches 110. The OPL 410 may be removed by a plasma ash process.

A liner 810 is deposited after the OPL 410 is removed. The deposition of the liner 810 results in the intermediate structure 800 shown in FIG. 8. The liner 810 may be comprised of tantalum, tantalum nitride (TaN), ruthenium (Ru), or a combination. A PVD or CVD process may be used to deposit the liner 810. As FIG. 8 indicates, the result of a CVD process is shown such that the liner 810 is conformally deposited. With the liner 810 in place, copper (Cu) 910 is deposited as the contact metal, as shown for the intermediate structure 900 in FIG. 9. Based on a chemical mechanical planarization (CMP) process, the intermediate structure 1000 of FIG. 10, with the source and drain contacts 1010, results.

Figure 11:
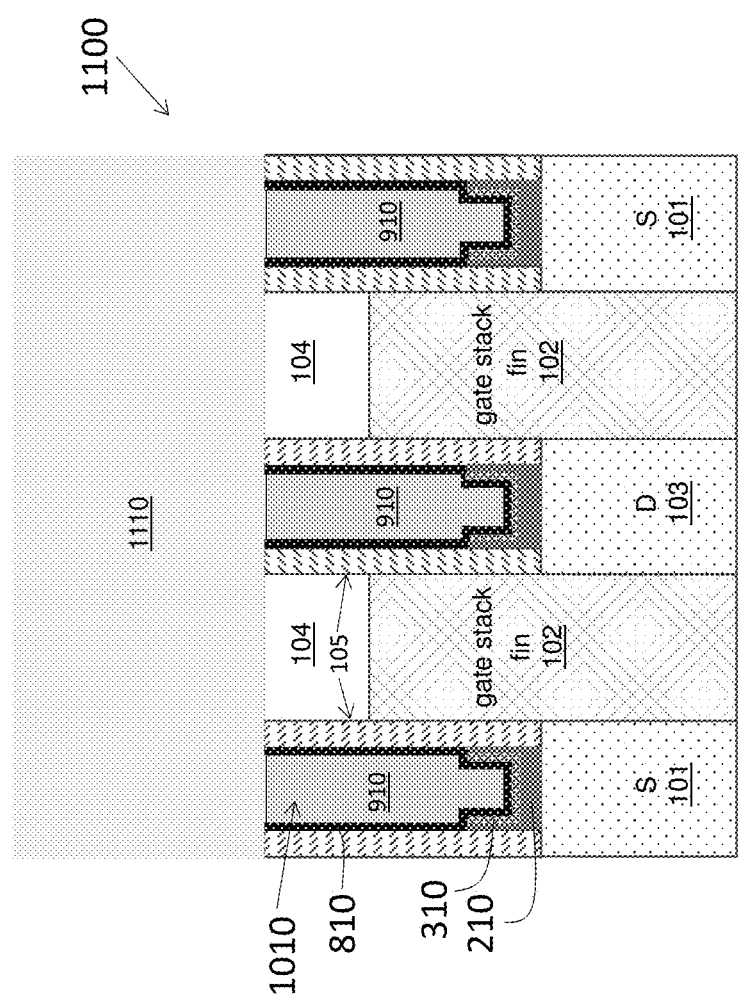
Figure 12:
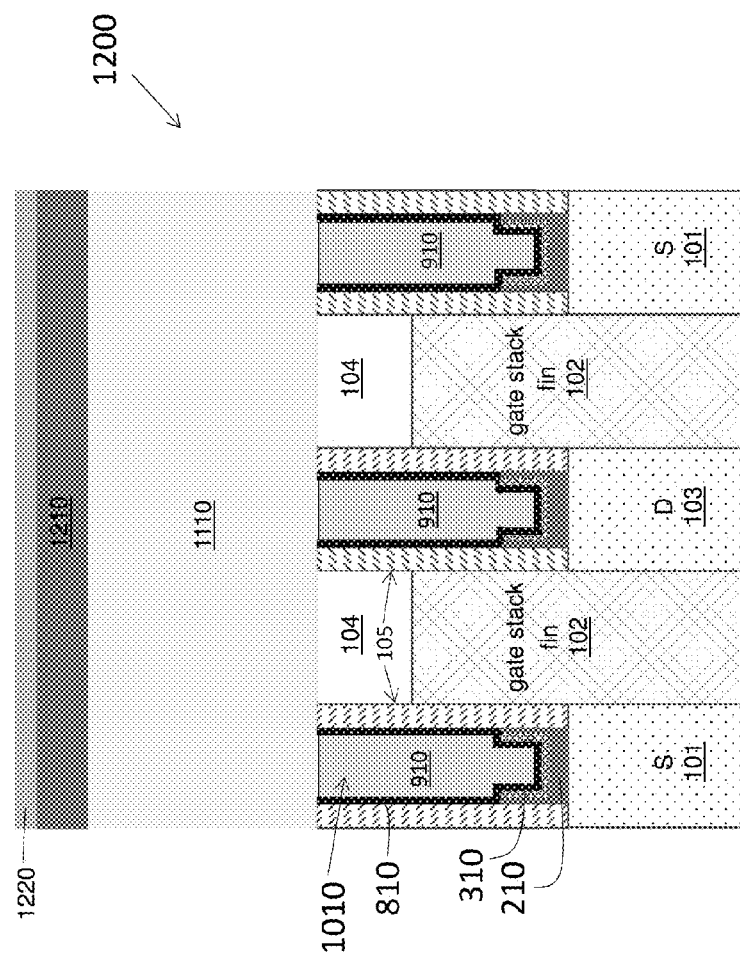
Figure 22:
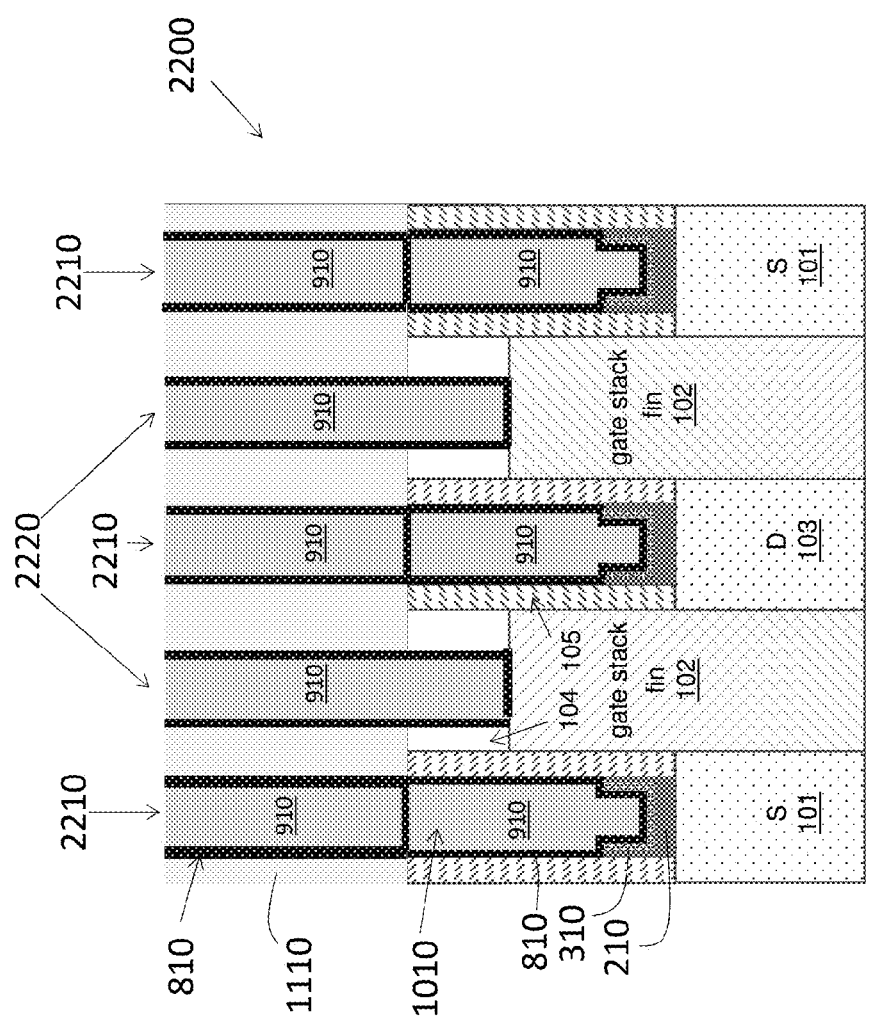

Fabrication of the full CMOS device entails additional known processes such as the addition of multiple metal levels and includes the processes shown in FIGS. 11-22. FIG. 11 shows the result of depositing an interlayer dielectric (ILD) material 1110 (e.g., silicon oxide ($SiO_2$)) on the intermediate structure 1000. The thickness of the interlayer dielectric material 1110 may be on the order of 300 to 600 nm. This thickness defines the height of the resulting upper-level source and drain contacts 2210 (FIG. 22). An organic planarization layer (OPL) 1210 and a silicon-based anti-reflective coating (SiARC) 1220 are deposited on the interlayer dielectric material 1110 to provide the intermediate structure 1200 shown in FIG. 12. The OPL layer 1210 may be 100 to 300 nm thick, and the SiARC 1220 may be 35-50 nm thick.

Figure 13:
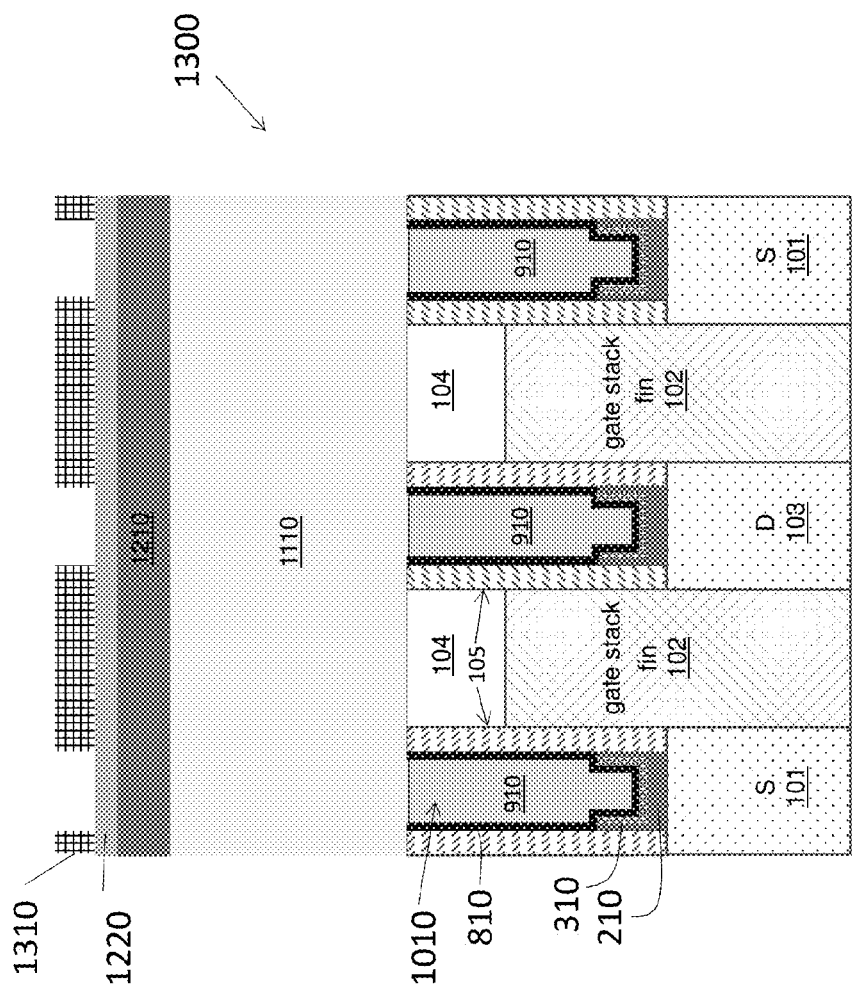
Figure 14:
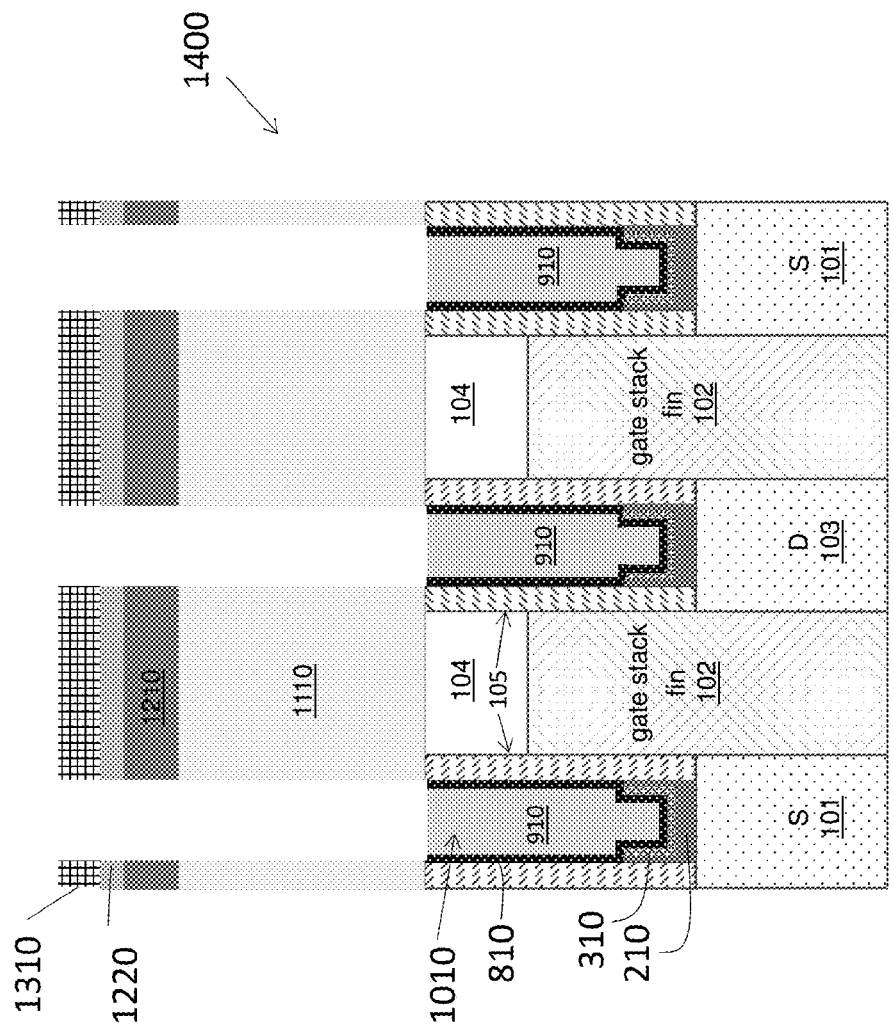
Figure 15:
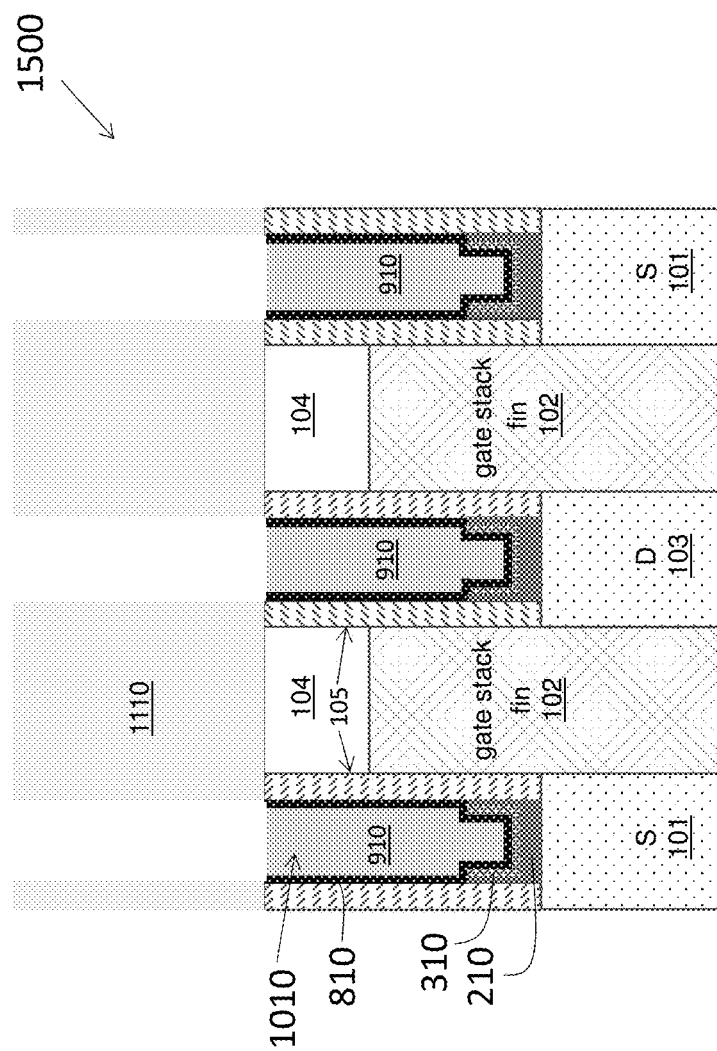

FIG. 13 shows the resulting intermediate structure 1300 based on depositing a resist 1310 on the SiARC 1220 and patterning the resist 1310 using a mask such that openings in the resist 1310 match with the locations of the source and drain contacts 1010. The resist 1310 may be on the order of 200 nm thick. An RIE process is used extending the openings in the resist 1310 down to the source and drain contacts 1010, as shown for the intermediate structure 1400 in FIG. 14. Stripping the OPL 1210, SiARC 1220, and resist 1310 layers using oxygen and nitrogen-based plasma processes results in the intermediate structure 1500 shown in FIG. 15.

Figure 16:
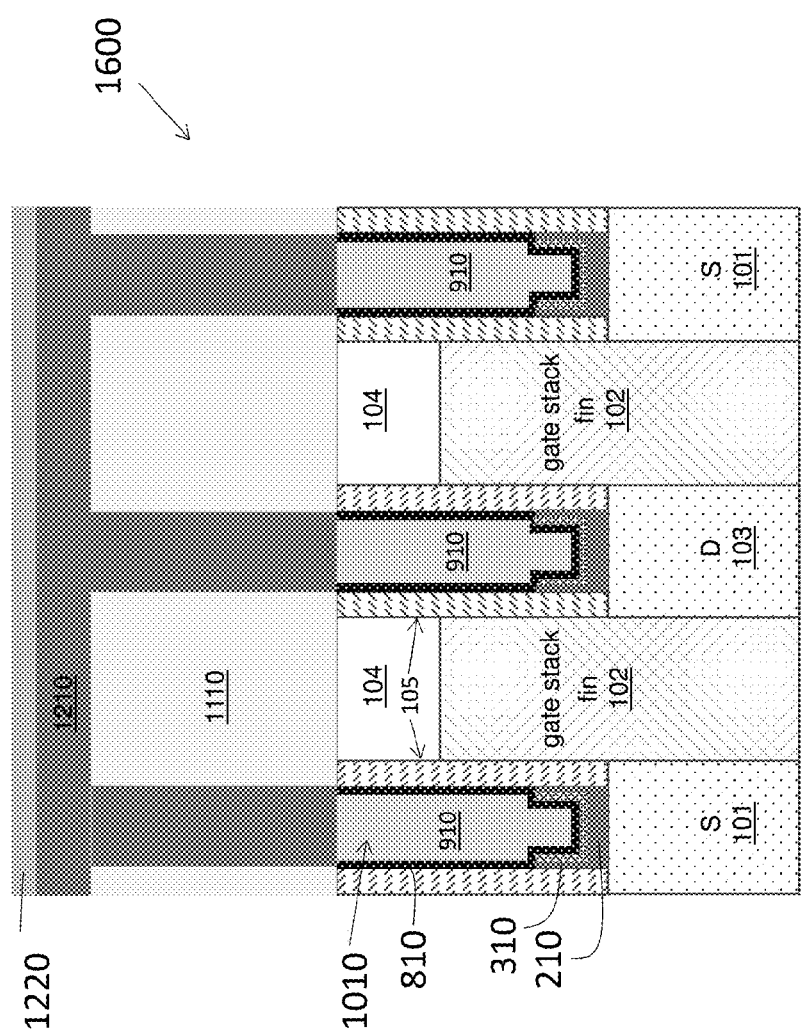
Figure 17:
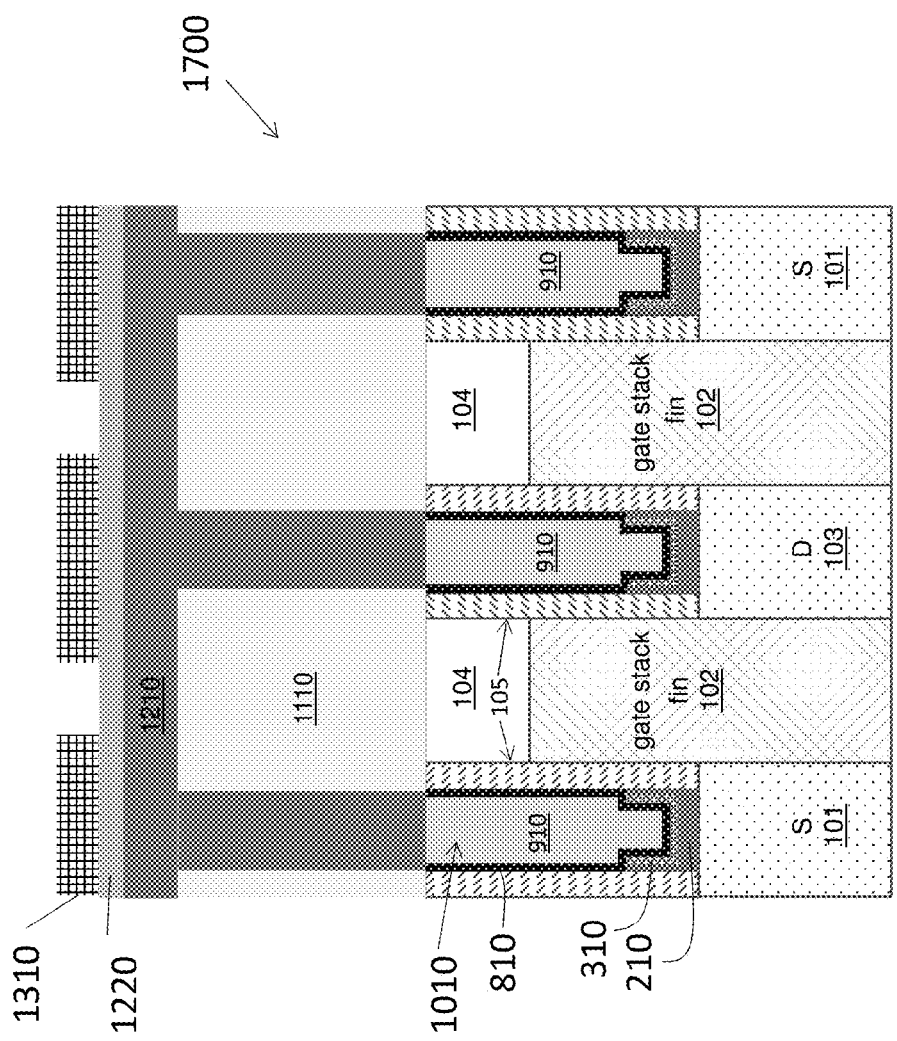
Figure 18:
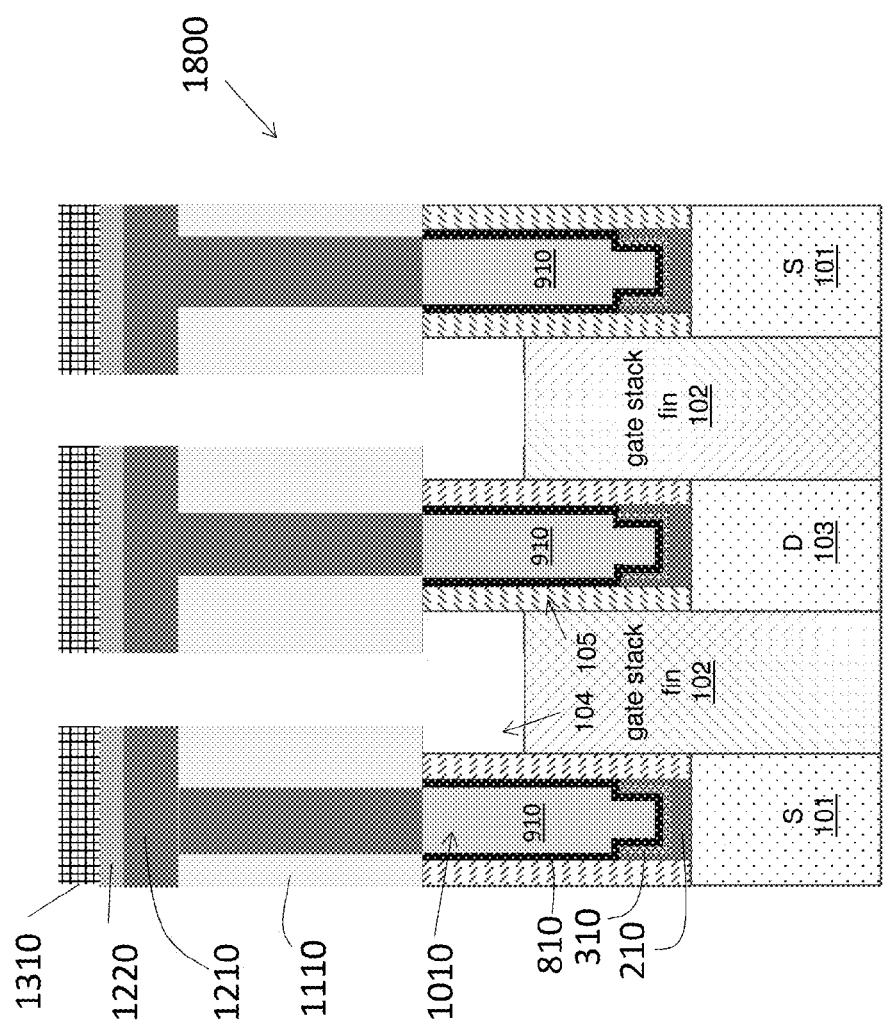

FIG. 16 show the intermediate structure 1600 that results from depositing another OPL layer 1210 and SiARC 1220 layer. As FIG. 16 indicates, the OPL layer 1210 fills the opening created in the intermediate structure 1500. A resist 1310 is deposited and patterned with a mask to result in the intermediate structure 1700 shown in FIG. 17. The patterning results in openings above the gate stacks 102. The openings in the resist 1310 are extended down to the gate stacks 102 using an RIE process, as shown for the intermediate structure 1800 shown in FIG. 18. Oxygen and nitrogen-based plasma processes are used to remove the OPL layer 1210, SiARC 1220, and resist 1310. This gives the intermediate structure 1900 shown in FIG. 19. As the figures indicate, the processes shown at FIGS. 11-15 to create openings for the upper-level source and drain contacts 2210 (FIG. 22) are similar to the process shown at FIGS. 16-19 to create openings for the gate contacts 2220 (FIG. 22).

Figure 19:
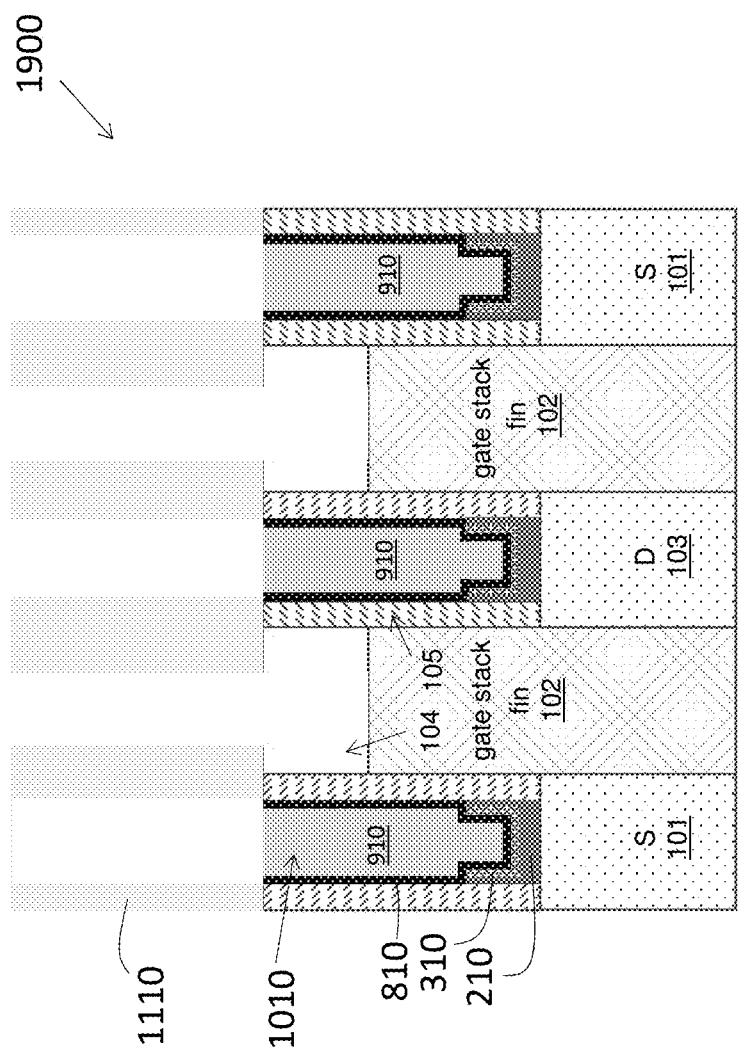
Figure 20:
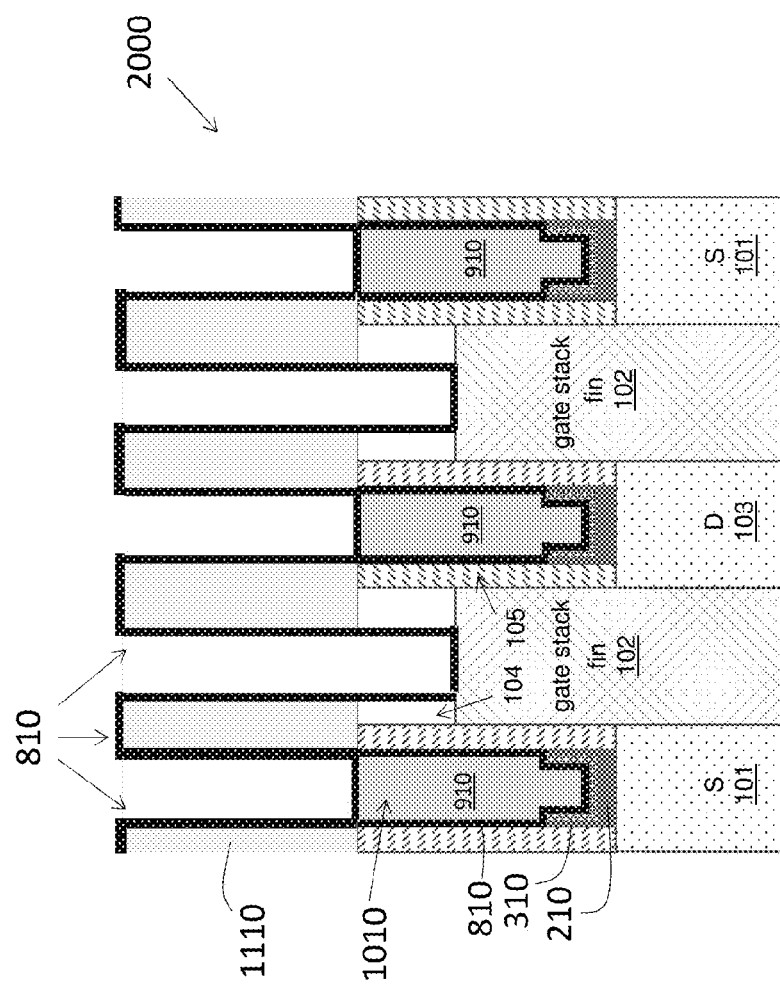
Figure 21:
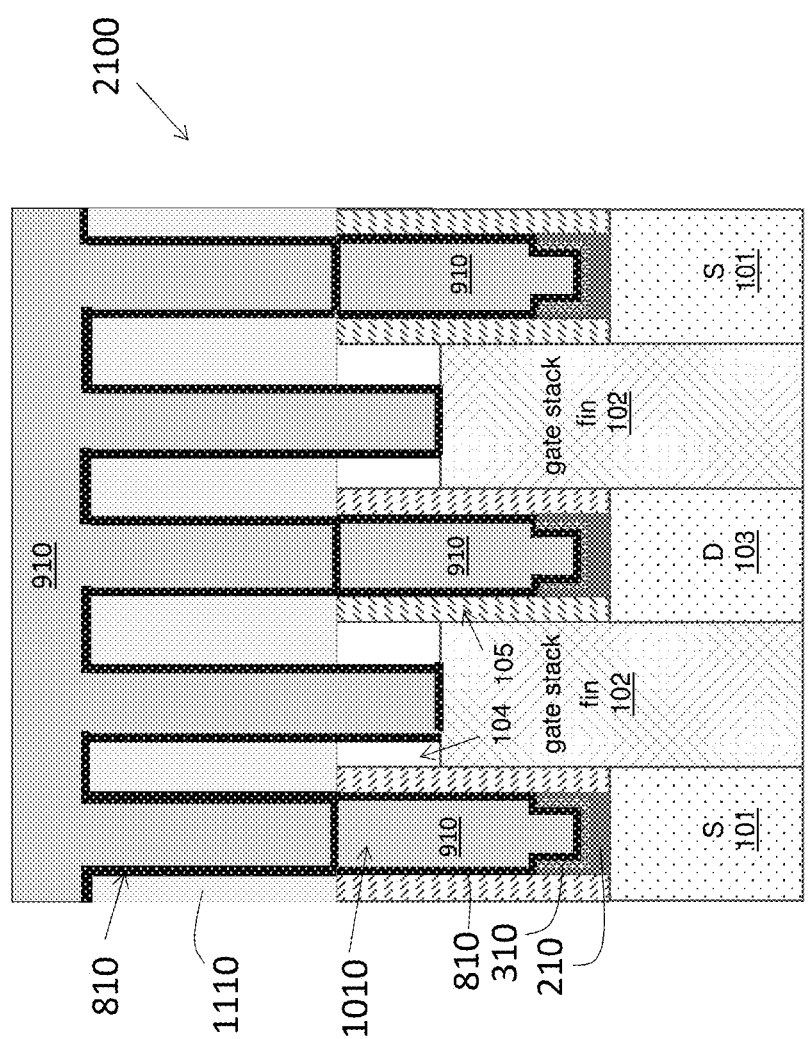

FIG. 20 shows the intermediates structure 2000 that results from deposition of the liner 810 (e.g., tantalum, tantalum nitride (TaN), ruthenium (Ru), or a combination) over the intermediate structure 1900 of FIG. 19. The liner 810 is deposited conformally to line the openings for the upper-level source and drain contacts 2210 (FIG. 22) and the gate contacts 2220 (FIG. 22). This is followed by a high-throughput physical vapor deposition (HT PVD) of Cu 910, resulting in the intermediate structure 2100 of FIG. 21. A CMP process is performed, as discussed with reference to FIG. 10 with regard to the source and drain contacts 1010. This results in the intermediate structure 2200 of FIG. 22, which includes upper-level source and drain contacts 2210 and gate contacts 2220.

The source and drain contacts 1010 that are formed according to the embodiments discussed herein differ from prior source and drain contacts in ways that result in reduced resistance. Specifically, the source and drain contacts 1010 according to the embodiments herein have a higher volume of contact metal and, therefore, a lower contact resistance. One aspect of the fabrication that leads to the increased volume of contact metal is a consequence of the stripping of the Ti 210 and TiN 310 layers above the OPL 410, as shown in FIG. 6. The result of this stripping is that the volume of the trenches 110 available for deposition of the contact metal Cu 910 is larger than if the Ti 210 and TiN 310 were retained along the entirety of the sidewalls of the trenches 110. Additionally, if the contact metal were tungsten (W) rather than Cu 910, which does not raise fluorine diffusion concerns, then the TiN 310 layer would have to be retained (or added back along with deposition of the liner 810) prior to the contact metal fill. This TiN 310 layer along the sidewalls of the trenches 110 would undo some of the volume gains of the contact metal based on the stripping. Thus, a combination of stripping the majority of the Ti 210 and TiN 310 layers and using a Cu 910 fill results in increased contact metal volume and, consequently, reduced contact resistance.

Figure 5:
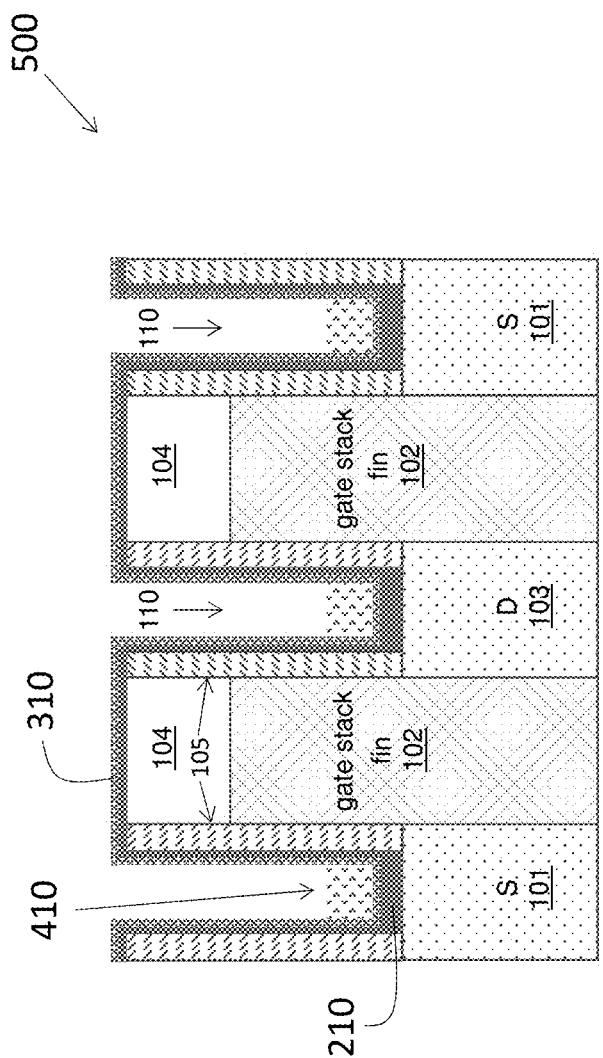
Figure 23:
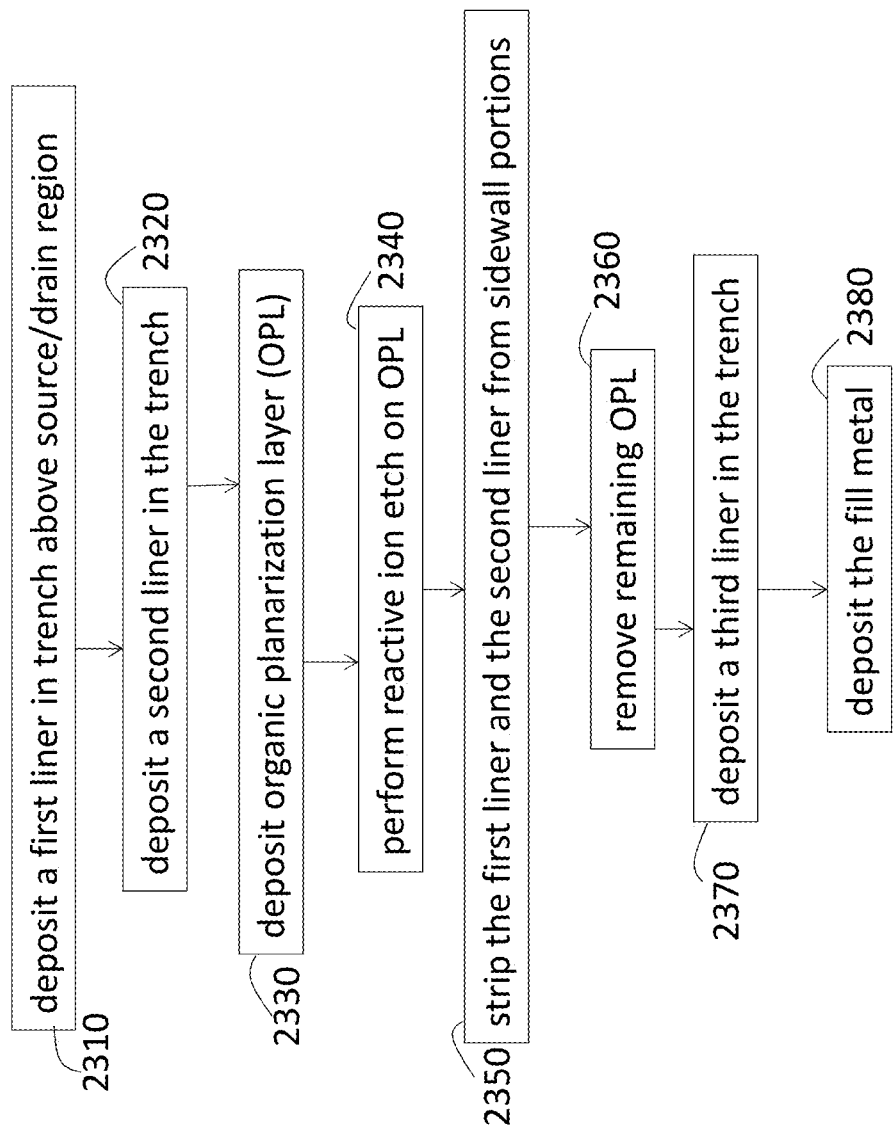
FIG. 23 is a process flow of a method of fabricating source and drain contacts according to embodiments.

FIG. 23 is a process flow of a method of fabricating source and drain contacts 1010 according to embodiments. At block 2310, depositing a first liner in a trench 110 above a source 101 or drain 103 region includes depositing the Ti 210 layer conformally, as shown in FIG. 2. Depositing a second liner, at block 2320, includes depositing the TiN 310 over the Ti 210 layer, as shown in FIG. 3. At block 2330, depositing the OPL 410 layer, as shown at FIG. 4, is followed by performing an RIE process on the OPL 410, at block 2340. The RIE process adjusts the thickness of OPL 410 remaining in the trench 110, as shown in FIG. 5. Stripping the first liner and the second liner from sidewall portions of the trench 110, at block 2350, may be performed using a wet etch process, as shown at FIG. 6. This is followed by removing the remaining OPL 410, at block 2360, as shown at FIG. 7.

Figure 8:
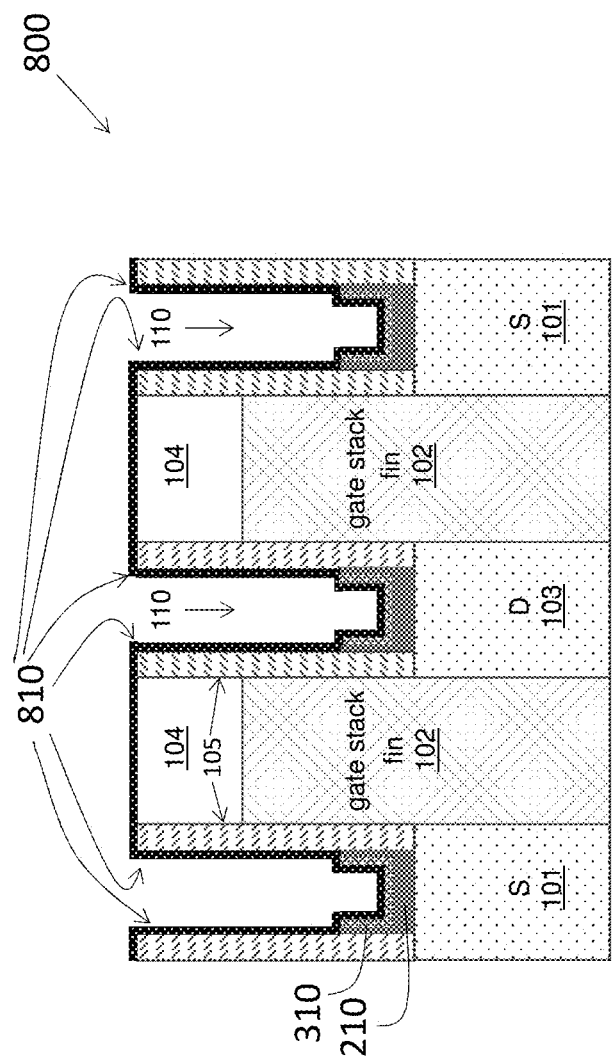
Figure 9:
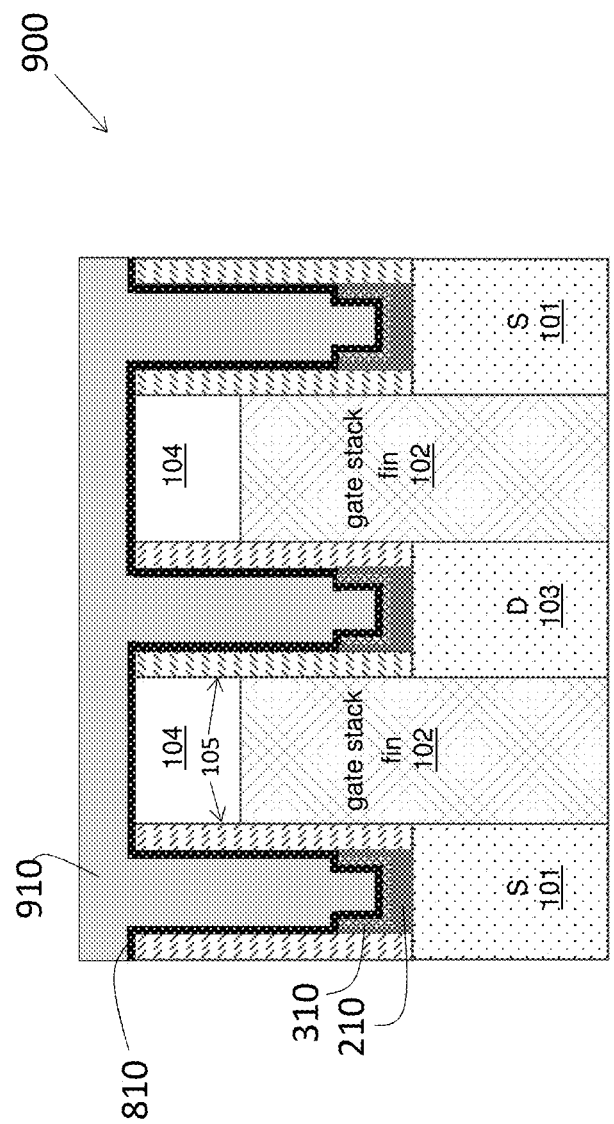
Figure 10:
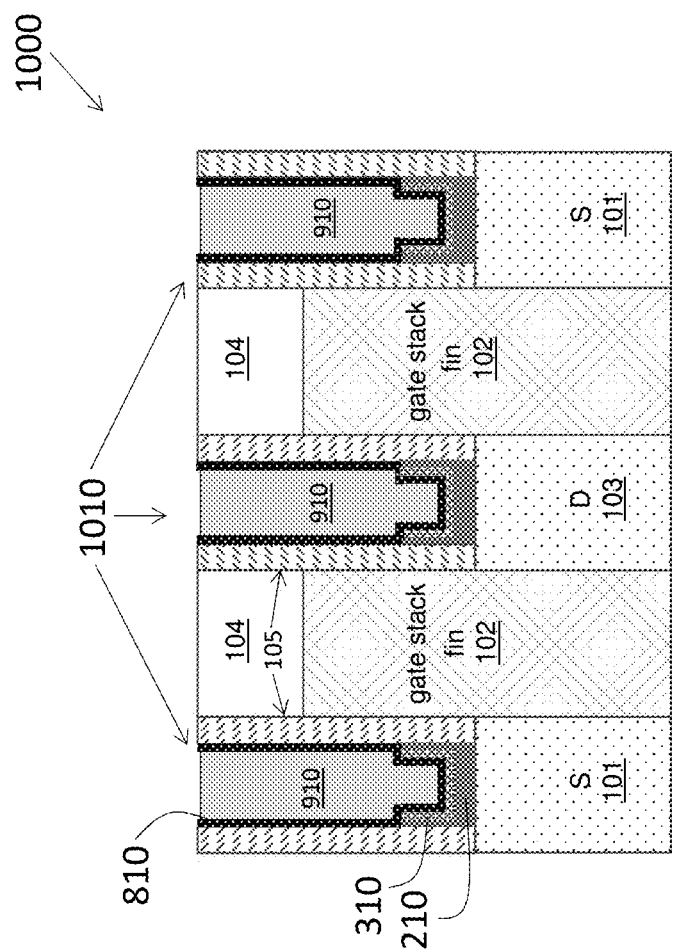

At block 2370, depositing a third liner in the trench 110 includes the liner 810 (e.g., tantalum, tantalum nitride (TaN), ruthenium (Ru), or a combination), as shown at FIG. 8. At block 2380, depositing the fill metal includes depositing Cu 910 and performing a CMP process to form the contact 1010, as shown in FIGS. 9 and 10. With the third liner conformally deposited in the trench 110, this liner forms a barrier between the second liner (310) and the Cu 910 fill.

Generally, deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Further, removal (or stripping) is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A contact for a source or drain region of an integrated circuit, the contact comprising:
   a first liner conformally disposed to cover a bottom of the contact and along a sidewall of the contact from the bottom to a height, the height being less than a full height of the contact such that a portion of the sidewall of the contact is not covered by the first liner;
   a second liner conformally disposed over the first liner on the bottom and up to the height of the sidewall of the contact;
   a third liner conformally disposed over the second liner on the bottom and up to the height of the sidewall and also covering the portion of the sidewall of the contact; and
   a metal fill filling a volume of the contact defined by the third liner.

2. The contact according to claim 1, wherein the first liner is titanium.

3. The contact according to claim 1, wherein the second liner is titanium nitride.

4. The contact according to claim 1, wherein the third liner is tantalum.

5. The contact according to claim 1, wherein the third liner is tantalum nitride.

6. The contact according to claim 1, wherein the third liner is ruthenium.

7. The contact according to claim 1, wherein the third liner is a combination of tantalum, tantalum nitride, and ruthenium.

8. The contact according to claim 1, wherein the metal fill is copper.

9. The contact according to claim 1, wherein the height is a sum of 6-15 nanometers and a thickness of the first liner and the second liner on the bottom of the contact.

10. The contact according to claim 1, wherein a thickness of a combination of the first liner and the second liner along the sidewall up to the height of the sidewall is 7-20 nanometers.

11. The contact according to claim 1, wherein the first liner is deposited on the source region of the integrated circuit.

12. The contact according to claim 1, wherein the first liner is deposited on the drain region of the integrated circuit.

13. The contact according to claim 1, wherein the metal fill is covered by a liner of another contact.

14. The contact according to claim 1, wherein the third liner covering the portion of the sidewall of the contact is adjacent to an interlayer dielectric material.

* * * * *